(12) United States Patent
Bennett et al.

(10) Patent No.: US 9,219,191 B2
(45) Date of Patent: Dec. 22, 2015

(54) TUNEABLE QUANTUM LIGHT SOURCE

(75) Inventors: Anthony John Bennett, Cambridge (GB); Martin Brian Ward, Cambridge (GB); Andrew James Shields, Cambridge (GB)

(73) Assignee: Kabushiki Kaisha Toshiba, Tokyo (JP)

(*) Notice: Subject to any disclaimer, the term of this patent is extended or adjusted under 35 U.S.C. 154(b) by 145 days.

(21) Appl. No.: 12/903,490

(22) Filed: Oct. 13, 2010

(65) Prior Publication Data

US 2011/0108743 A1 May 12, 2011

(30) Foreign Application Priority Data

Nov. 6, 2009 (GB) .................................. 0919532.2

(51) Int. Cl.
*H01L 33/04* (2010.01)
*H01L 33/06* (2010.01)
*B82Y 20/00* (2011.01)
*H01L 33/00* (2010.01)
*H01L 33/08* (2010.01)
*H01L 33/10* (2010.01)
*H01S 5/34* (2006.01)

(52) U.S. Cl.
CPC ............... *H01L 33/06* (2013.01); *B82Y 20/00* (2013.01); *H01L 33/0012* (2013.01); *H01L 33/08* (2013.01); *H01L 33/105* (2013.01); *H01S 5/3412* (2013.01); *H01S 5/3416* (2013.01)

(58) Field of Classification Search
USPC .......................................... 257/13; 977/774
See application file for complete search history.

(56) References Cited

U.S. PATENT DOCUMENTS

2002/0196827 A1 12/2002 Shields et al.
2003/0127608 A1 7/2003 Shields et al.

FOREIGN PATENT DOCUMENTS

EP 1 955 422 A2 8/2008
EP 2 308 143 A2 4/2011
GB 2 367 690 A 4/2002

(Continued)

OTHER PUBLICATIONS

International Search Report and Written Opinion of the International Searching Authority issued May 12, 2011, in PCT/GB2010/002038.

(Continued)

*Primary Examiner* — Fernando L Toledo
*Assistant Examiner* — Valerie N Newton
(74) *Attorney, Agent, or Firm* — Oblon, McClelland, Maier & Neustadt, L.L.P.

(57) ABSTRACT

A photon source comprising a semiconductor heterostructure, said semiconductor heterostructure comprising a quantum well, a barrier region adjacent said quantum well and a quantum dot provided in said quantum well, the photon source further comprising electrical contacts and a power supply coupled to first and second electrical contacts configured to apply a tuneable electric field across said quantum dot to control the emission energy of said quantum dot, said electric field being tuneable across an operating range an wherein the tunneling time of carriers from said quantum dot to said first electrical contact and the tunneling time of carriers from said quantum dot to said second electrical contact are greater than the radiative decay time of an exciton in said quantum dot over said operating range for controlling the emission energy, said photon source being configured such that emission from a single quantum dot exits said photon source.

9 Claims, 13 Drawing Sheets

(56) References Cited

FOREIGN PATENT DOCUMENTS

| GB | 2 380 605 A | 4/2003 |
| --- | --- | --- |
| GB | 2 439 595 A | 1/2008 |
| GB | 2 460 666 A | 12/2009 |
| JP | 2007-329344 A | 12/2007 |
| JP | 2009-216775 A | 9/2009 |
| WO | WO 2007/062625 A2 | 6/2007 |
| WO | WO 2010/012268 A2 | 2/2010 |

OTHER PUBLICATIONS

P. A. Dalgarno, et al., "Decay dynamics of the positively charged exciton in a single charge tunable self-assembled quantum dot", Applied Physics Letters, vol. 89, No. 4, XP 12088163, Jul. 2006, pp. 1-3.

M. Kroner, et al., "Voltage-controlled linewidth of excitonic transitions in a single self-assembled quantum dot", Physica E, vol. 32, XP 25179116, May 2006, pp. 61-64.

P. A. Dalgarno, et al., "Hole recapture limited single photon generation from a single $n$-type charge-tunable quantum dot", Applied Physics Letters, vol. 92, No. 19, XP 12106915, May 2008, pp. 1-3.

E. S. Moskalenko, et al., "Effective optical manipulation of the charge state and emission intensity of the InAs/GaAs quantum dots by means of additional infrared illumination", Applied Physics Letters, vol. 85, No. 5, XP 12064096, Aug. 2, 2004, pp. 754-756.

Combined Search and Examination Report under Sections 17 and 18 (3) issued Mar. 8, 2010, in United Kingdom Patent Application No. GB0919532.2.

R. M. Stevenson, et al., "A semiconductor source of triggered entangled photon pairs", Nature, vol. 439, Jan. 12, 2006, pp. 179-182.

A. J. Bennett, et al., "Indistinguishable photons from a diode", Applied Physics Letters, vol. 92, 2008, pp. 193503-1-193503-3.

J. Kim, et al., "A single-photon turnstile device", Nature, vol. 397, Feb. 11, 1999, pp. 500-503.

D. J. P. Ellis, et al., "Oxide-apertured microcavity single-photon emitting diode", Applied Physics Letters, vol. 90, 2007 pp. 233514-1-233514-3.

David J P Ellis, et al., "Cavity-enhanced radiative emission rate in a single-photon-emitting diode operating at 0.5 GHz", New Journal of Physics, vol. 10, 2008, pp. 1-8.

United Kingdom Search Report issued Jun. 14, 2012 in patent application No. GB1201192.0.

Office Action issued Nov. 26, 2013 in Japanese Patent Application No. 2012-535925 (with English language translation).

TUNEABLE QUANTUM LIGHT SOURCE

CROSS-REFERENCE TO RELATED APPLICATIONS

This application is based upon and claims the benefit of priority from UK Patent Application No. 0919532.2 filed Nov. 6, 2009; the entire contents of which are incorporated herein by reference.

FIELD

Embodiments described herein relate generally to photon emitters, particularly those that can be operated to output single photons or pairs of photons on demand for use in quantum communication and computing.

BACKGROUND

In the field of quantum cryptography, there is a need to reliably produce single photons. One photon source which has been previously suggested for producing single photons is based on quantum dots. In a quantum dot, an exciton is formed when there is a bound state between a small number of electrons in the conduction band and holes in the valence band, radiative decay occurring when one hole and one electron recombine resulting in the emission of a photon. Due to the generation process, the time at which the photon is emitted can be carefully controlled and such a process cannot give rise to the emission of two photons at the same time due to the Pauli Exclusion principle. Each combination of electrons and holes has different energy differences between the initial and final electronic states, leading to photons of different wavelengths, which are by convention labelled with the name of the initial state. As an example, if the dot contains two electrons and one hole, it can radiatively decay to emit a single photon labelled as the "negatively charged exciton", leaving one electron remaining in the dot. Such a transition is preferred for generation of coherent single photons as this transition is empirically observed to be most robust to decoherence.

In the field of quantum cryptography, quantum imaging and quantum computing there is also a need to produce pairs of photons. Such photons can be created from a cascade emission process in single quantum dots initially filled with two electrons and two holes, a "biexciton state". This state can emit "a biexciton photon" leaving one electron and one hole in a "(charge-neutral) exciton" state. This electron and hole then recombine to emit an "exciton" photon leaving the dot empty. Through control of the properties of the exciton state these two photons can be entangled.

A particularly popular material system is the formation of InAs quantum dots in GaAs. The emission wavelength may be tuned by applying an electric field across the quantum dot. However applying an electric field across the quantum dot causes the efficiency of the photon source to decrease since the applied field enhances tunneling of carriers out of the quantum dot before photon emission can occur.

BRIEF DESCRIPTION OF THE DRAWINGS

The present invention will now be described with reference to the following non-limiting embodiments in which.

DETAILED DESCRIPTION

Figure 1:
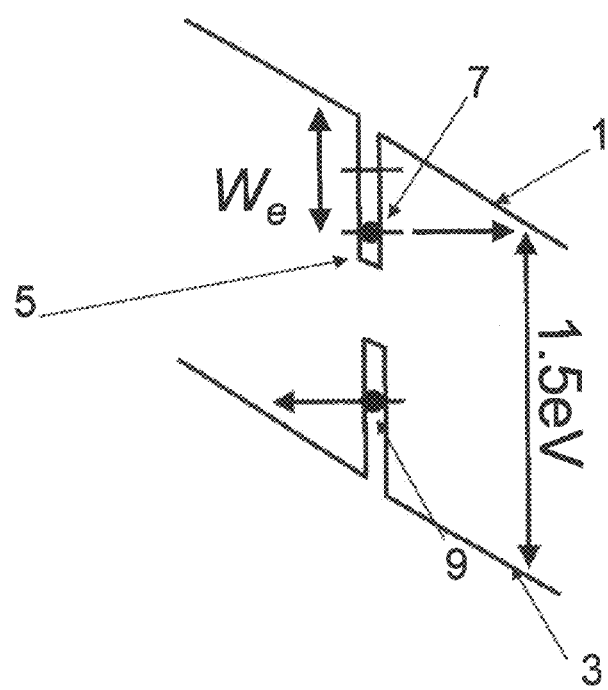
FIG. 1 is a band diagram of a simple quantum dot which will be used for explaining the principles behind the present invention.

According to one embodiment, a photon source comprising a semiconductor heterostructure is provided, said semiconductor heterostructure comprising a quantum well, a barrier region adjacent said quantum well and a quantum dot provided in said quantum well, the photon source further comprising electrical contacts and a voltage source coupled to first and second electrical contacts configured to apply a tuneable electric field across said quantum dot to control the emission energy of said quantum dot, said electric field being tuneable across an operating range, and wherein the tunneling time of carriers from said quantum dot is greater than the radiative decay time of an exciton in said quantum dot over said operating range for controlling the emission energy, said photon source being configured such that emission from a single quantum dot exits said photon source.

The tunneling time varies with applied bias. In the present invention the operating range is preferably in excess of 100 $KVcm^{-1}$.

In a further embodiment a photon source comprising a semiconductor heterostructure, said semiconductor heterostructure is provided comprising a quantum dot, the photon source further comprising electrical contacts and a voltage source coupled to first and second electrical contacts configured to apply a tuneable electric field across said quantum dot to control the emission energy of said quantum dot, said electric field being tuneable across an operating range of 100 $KVcm^{-1}$, and wherein the tunneling time of carriers from said quantum dot is greater than the radiative decay time of an exciton in said quantum dot over said operating range for controlling the emission energy, said photon source being configured such that emission from a single quantum dot exits said photon source.

Reducing the tunneling from the quantum dots over the operating range may be achieved in a number of ways. The semiconductor layers between the quantum dot and the first and or second contacts provide a barrier to tunneling, the barrier having at least a higher potential (for at least a part of its thickness) than the lowest electron energy level in said quantum dot. Where a quantum well is provided, the barriers, at least on the side of the quantum dot, where electron tunneling will occur, will preferably have a higher potential than the lowest electron energy level of said quantum well.

In one embodiment, the quantum dot region comprises a quantum well defined by said barrier region and said quantum dot is located in said quantum well. The barrier regions would be configured such that a quantum well is formed even in the absence of the quantum dots. The quantum dots are then provided in this well. The quantum well may have a square confinement potential or a graded confinement potential such as a triangular or parabolic potential.

The quantum well of said photon source may comprise a material having a lower band gap than said barrier layers, and wherein said lower band gap material is provided between two barrier layers.

Said barrier regions may be of different heights in terms of their potentials. They may also be of different widths measured in the direction of the applied electric field. In one embodiment, a barrier with a larger potential than said quantum well layer is only provided on one side of the quantum well. This barrier being provided to suppress electron tunneling.

In an embodiment, the quantum dot comprises InAs, said quantum well comprises GaAs and said at least one barrier region comprises AlGaAs or AlAs. The quantum well may also comprise AlGaAs and said barriers comprise AlGaAs, but in this situation, the barriers comprise AlGaAs with a higher Al content such that they provide a barrier to the quantum well. Where the quantum well is graded, GaAs may be provided at the centre of the well where the quantum dot is located.

Carriers may be supplied to the quantum dot via a number for methods, for example the source may comprise a voltage source configured to apply a first voltage across said electrical contacts to allow carriers to be provided to said quantum dot and a second voltage to tune the band-gap of said quantum dot. In a further embodiment, the source further comprises secondary electrical contacts configured to supply carriers to said quantum dot. A light source may also be used to provide carriers to said quantum dot.

In an embodiment the photon source has a p-i-n structure, where the quantum dot is located in the intrinsic region and p and n type contacts are provided on either side of the 'i' region.

The source may further comprise an optical cavity. A tuneable source is advantageous in this arrangement as the source may be tuned after fabrication to the resonance of the cavity.

In an embodiment, the photon source comprises a plurality of quantum dots, but emission will only be utilised from one quantum dot. This may be achieved by only providing carriers to one quantum dot or by providing carriers to many quantum dots but blocking emission from all but one quantum dot. Thus, said source may further comprise an electrically insulating layer provided with an aperture configured to allow carrier injection into a single quantum dot. Also, said source may further comprise an opaque layer configured to isolate the emission from one quantum dot.

The field applied across the source is configured to minimise fine structure splitting in the output of said source, this allows a source of entangled photon pairs to be produced.

In a yet further embodiment, a system for producing entanglement through interference of photons from separate sources is provided, said system comprising a first photon source in accordance with any preceding claim and a second photon source in accordance with any preceding claim, said first and second photon sources being tuned to emit identical photons, said system further comprising an interferometer configured to provide entanglement between identical photons output from the two sources.

In a further embodiment a quantum repeater is provided comprising a first photon source in accordance with any preceding claim, a second photon source and an interferometer configured to interfere a first photon from a pair of photons output by said first source and a photon from the second source, wherein the first photon source is configured to output an entangled pair of photons wherein one of the photons is identical to a photon outputted by the second photon source, such that during interference by said interferometer, the state of a photon emitted by the second photon source is mapped to the second photon from said photon pair.

In an embodiment a method of producing a photon of a selected wavelength is provided, said method comprising: providing a quantum dot in a semiconductor structure; providing carriers to said quantum dot to form an exciton; applying an electric field across said quantum dot using first and second electrical contacts provided to said semiconductor structure, said electric field being configured to modify the emission energy of the quantum dot, said electric field for controlling the emission energy being tuneable over an operating range; allowing carriers provided to said quantum dot to combine and output a photon at an energy selected by said applied electric field; wherein the semiconductor structure is configured to increase the tunneling time of carriers from said quantum dot to be greater than the radiative decay time of an exciton in said quantum dot over said operating range for controlling the emission energy.

In an embodiment, said quantum dot is provided within a quantum well. In another embodiment, the quantum dots are provided within a barrier material. In a further embodiment, a single barrier is provided to suppress electron tunneling.

In a further embodiment a method of producing two entangled photons is provided, said method comprising: providing a quantum dot in a semiconductor structure; providing carriers to said quantum dot to form a bi-exciton or higher order exciton; applying an electric field across said quantum dot using first and second electrical contacts provided to said semiconductor structure, said electric field being configured to modify the emission energy of the quantum dot, said electric field for controlling the emission energy being tuneable over an operating range; allowing carriers provided to said quantum dot to combine to produce a first photon from biexciton decay and a second photon produced by decay from the remaining exciton in said quantum dot; wherein the semiconductor structure is configured to increase the tunneling time of carriers from said quantum dot to be greater than the radiative decay time of an exciton in said quantum dot over said operating range for controlling the emission energy, and said electric field is tuned to a level to minimise fine structure splitting during bi-exciton-to-exciton-to-empty cascade decay.

In an embodiment the splitting of the energy levels is equal to or less than the homogenous line-width of the emission from the quantum dot. Quantitatively, the splitting should be equal to or less than 2 µeV, more preferably equal to or less than 1 µeV.

FIG. 1 is a schematic band diagram of a quantum dot. The band diagram shows the conduction band 1 and the valence band 3. A quantum dot 5 contains an electron 7 in the conduction band and a hole 9 in the valence band.

The quantum dot will emit radiation if the electron 7 in the conduction band and the hole 9 in the valence band combine to emit a photon. The presence of a single electron 7 in the conduction band and a single hole 9 in the valence band forms a bound state termed a single exciton X.

FIG. 1 shows a simplified arrangement where there is just a single neutral exciton present. However, the formation of bi-excitons which comprise two electrons in the conduction band and two holes in the valence band or charged excitons where there are uneven numbers of electrons and holes are also possible.

However, it is possible that emission of a photon be suppressed if either the electron 7 tunnels out of the quantum dot 5 as indicated by the arrow or the hole 9 tunnels out of the quantum dot 5 as indicated by the arrows. The tunneling rate, $|T|^2$ through a triangular barrier can be modelled as:

$$|T|^2 = \exp[-Cm^{*1/2}W^{3/2}E^{-1}]$$

Where C=a constant, E=electric field, m*=effective mass of tunneling particle, W=confinement potential. As E increases, tunneling rate increases. As m* increases, tunneling falls. As W increases, tunneling falls Therefore, from the above, it can be seen that as a vertical electric field is applied to the quantum dot, the probability of tunneling increases, since E increases, and hence the emission efficiency of the device falls.

However, it is also seen that as the barrier height W increases, then it is possible to suppress tunneling.

Figure 2:
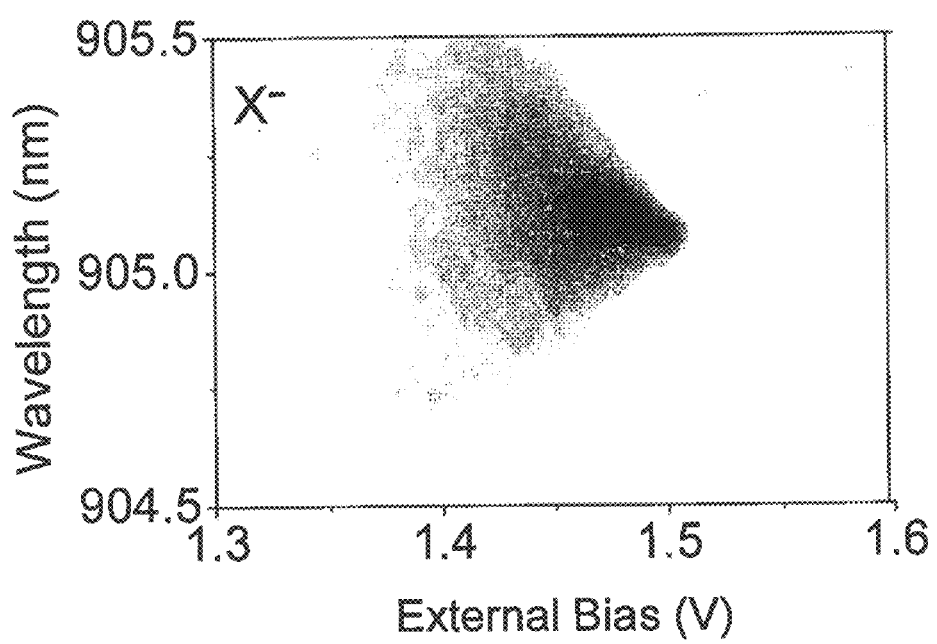
FIG. 2 is a plot showing photoluminescence emission from a dot of the type described with reference to FIG. 1, the emission wavelength is plotted along the y-axis and external bias along the x-axis.

FIG. 2 shows photoluminescence emission from a dot of the type described with reference to FIG. 1 as the bias is changed. The results are shown from an InAs quantum in GaAs. The plot shows emission wavelengths along the y-axis against external bias along the x-axis, with intensity plotted as contrast. It can be seen that as the external bias is decreased from 1.5 volts (where the external bias cancels the internal potential and thus there is no electric field in the region of the dot), carriers tunnel out of the bound state and the emission line broadens and becomes less intense. This can be seen by the lightening of the data as the bias approaches 1.4 volts. However, it can also be seen from this figure that the wavelength also varies dependent on the bias.

FIG. 3a is a schematic of a photon emitter in accordance with the prior art. The device comprises a plurality of InAs quantum dots 21 formed at interface 23 between an upper 25 GaAs layer and a second lower 27 GaAs layer. Above the upper GaAs layer there is a p-type contact and below the lower 27 GaAs layer there is an n-type contact.

The corresponding band diagram is shown in FIG. 3b. Here, a single dot 31 is provided at the interface between the lower GaAs layer 27 as shown in FIG. 3b and the upper GaAs layer 25 of FIG. 3a. The quantum dot has an electron 33 located in the conduction band and a hole 35 located in the valence band. The electron 33 will eventually tunnel towards the n-doped region 37 and the hole 35 will tunnel towards the p-doped region 39. If the electron 33 or hole 35 tunnels before recombination, then no photon will be emitted.

FIG. 4a and its corresponding band diagram FIG. 4b illustrate a design in accordance with an embodiment of the present invention. Barrier layers are provided and are configured to prevent tunneling of the carriers out of the quantum dot before recombination.

In the embodiment of FIGS. 4a and 4b, a plurality of quantum dots 21 are formed at an interface 81 between a lower Gallium Arsenide layer 83 and an upper Gallium Arsenide layer 89. The upper 89 and lower 83 Gallium Arsenide layers are in contact with upper 91 and lower 85 barriers layers respectively. The upper and lower barrier layers 85 and 91 are higher band gap layers which may for example be AlGaAs. This arrangement with the upper and lower Gallium Arsenide layers 89 and 83 sandwiched between the upper and lower barrier layers 91 and 85 result in the Gallium Arsenide layers forming a quantum well.

The barrier layers are provided close enough to the interface 81 where the quantum dots are formed such that they provide a further degree of electrical confinement than if the barrier layer were not present. The GaAs layers between the barrier layers forms a quantum well.

The corresponding band diagram is shown in FIG. 4b. Here, the quantum dot 95 is located in quantum well 97 which is formed by upper and lower GaAs layers 89 and 83. This is then formed between upper and lower barrier layers 91 and 85 which serve to suppress tunneling from the quantum dot in the same manner as described with reference to FIGS. 4a and 4b and 5a and 5b.

As the quantum dots in the above design are formed in GaAs, the properties of the quantum dots are well understood since this is a typical material of forming the quantum dots.

By using the barrier material, tunneling is suppressed from the quantum dot for longer which enhances the emission efficiency of the photon emitter. This can lead to tuning over a wavelength range of more than 14 nm as greater than 400 KV/cm of field may be applied without destroying emission efficiency.

In FIGS. 4a and 4b, the structure is a p-i-n structure with one side of the device being p-type and the other side n-type with the dot located in the undoped region. However, similar results would be obtained with n-i-p, n-i-n, p-i-p or ohmic-i-schottky devices provided that the quantum dot and barriers are configured in a similar fashion.

Figure 4:
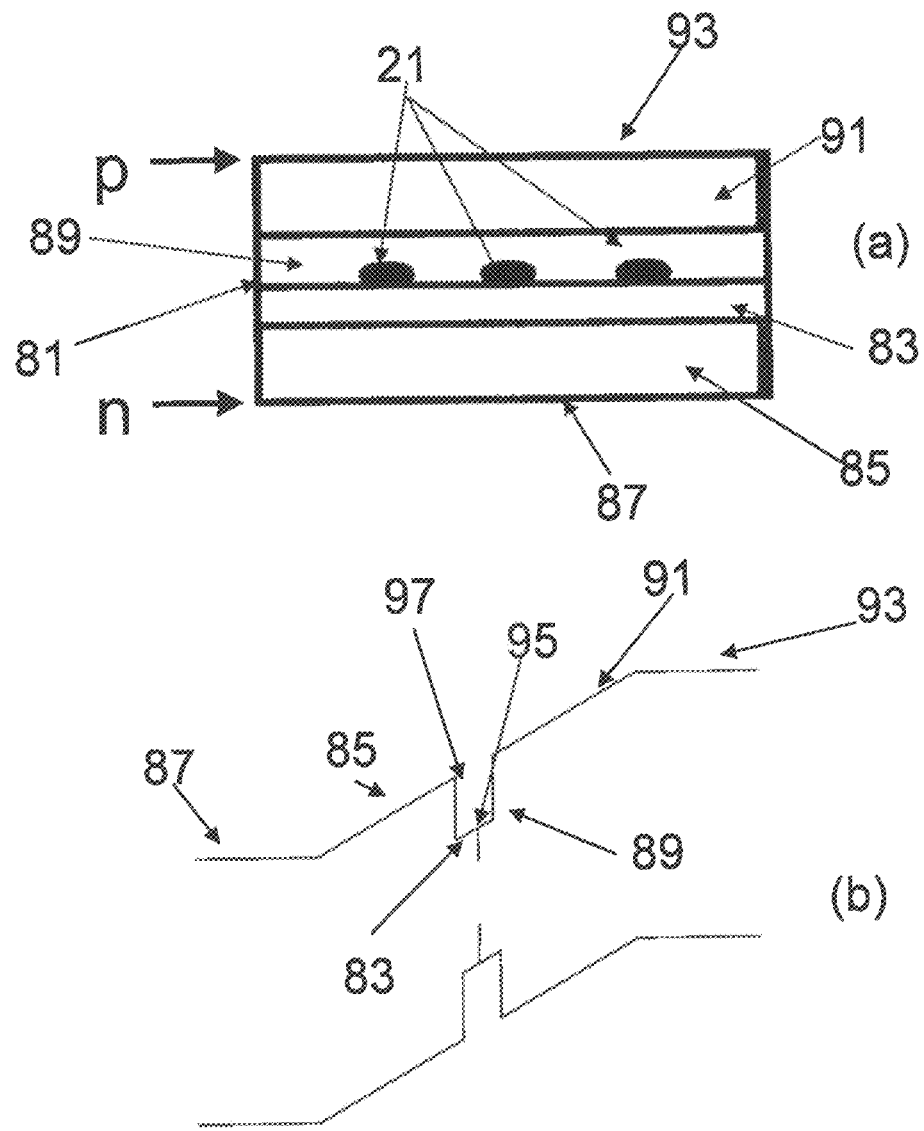
FIG. 4a is a schematic of a photon emitter in accordance with an embodiment of the present invention and FIG. 4b is its corresponding band diagram.

In the embodiment shown in FIG. 4 we consider a particular case where the barriers are equal and the spacing between them small enough to lead to quantisation of the electronic states within the "quantum well". This occurs when the carriers are confined within a sufficiently strong potential to a region comparable to the de Broglie wavelength of the particles.

FIG. 4 shows barriers on either side of the dot to suppress tunneling of carriers out of the dot. It is preferable if height, position or thickness of one or both of these barriers is selected such that the distance from the dot to the barrier is small enough that there is not a confined state at the edge of the barrier where carriers could tunnel to, leaving the dot. Electrons and holes (which have different effective masses) will have equal tunneling rates for unequal heights of barrier on either side of the dot.

By minimising the tunneling of both electrons and holes out of the quantum dot while an electric field is applied, a larger tuning range for the photon source may be achieved.

The tunneling time for both electrons and holes is longer than the radiative lifetimes of excitons formed within the quantum dot. For InAs/GaAs quantum dots the X and X- states have lifetimes of 1 ns. This will ensure that the majority of carriers radiatively recombine, and keep efficiency above 50%. Tunnelling will generally occur from the quantum dot towards the contacts. Thus electrons will tunnel towards a n-type contact and holes towards a p-type contact. Although carriers will tunnel towards the contacts many will tunnel into an intrinsic region where they will be swept by the electric field to the contacts. The tunneling time for electrons towards an n-type contact and holes towards a p-type contact should be greater than the radiative decay time.

Figure 5:
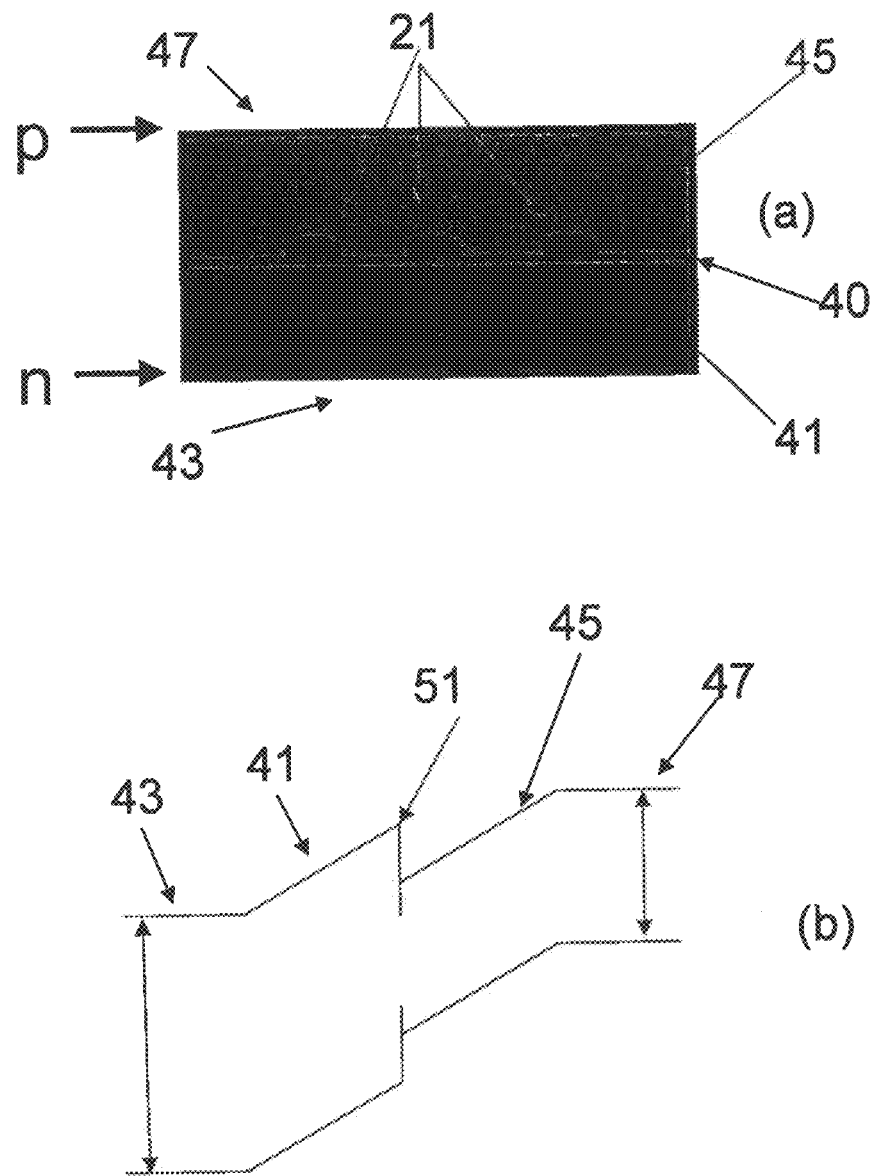
FIG. 5a is a schematic of a photon emitter in accordance with an embodiment of the present invention and FIG. 5b is its corresponding band diagram.
FIG. 5c is a variation on the emitter of FIG. 5a and FIG. 5d is its corresponding band diagram.
Figure 5:
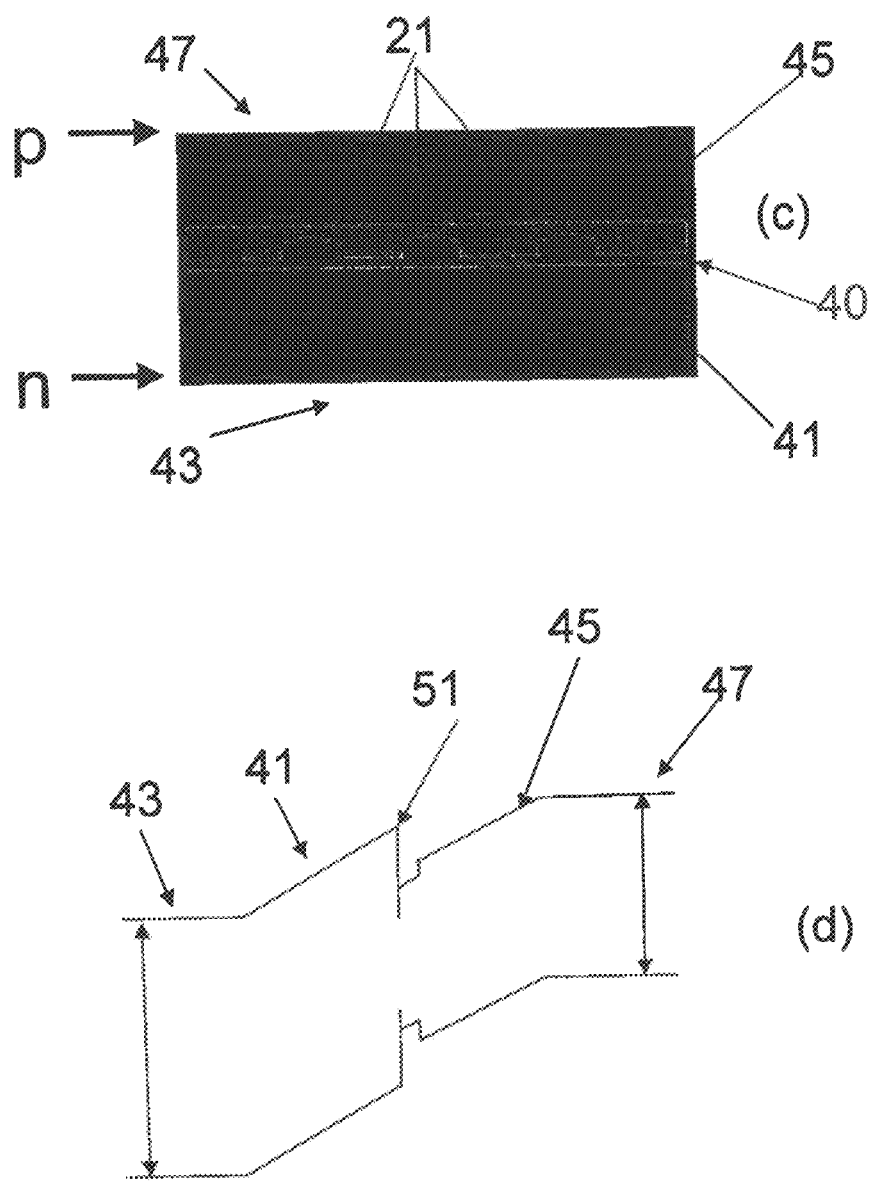

FIGS. 5a and 5b show a variation on the device of FIG. 4. In the device of FIG. 5, the barriers are maximally unequal. In this configuration at biases away from flat band there is still a "V" shaped quantum well at the side of the barrier (formed between the vertical potential step on one side, and the slope of the conduction band on the other). In this configuration only electrons will be confined to a greater extent.

In FIG. 5a, a plurality of quantum dots 21 are located at an interface between a lower layer 41 and an upper layer 45. The lower layer 41 is connected to an n-type contact 43 and the upper layer 45 is connected to a p-type contact 47. The corresponding band diagram is shown in FIG. 5b. The distance between the quantum dots 21 and the p-type contact 47 must be large enough to prevent tunneling of holes out of the quantum dot.

In FIG. 5b a single quantum dot 51 is provided at the interface between the upper layer 45 and the lower layer 41. The lower layer 41 has a higher band gap than the upper layer 45. The lower layer 41 is connected to the n-type region 43. As the effective mass of a hole in a quantum dot is much greater than the effective mass of an electron, the electron is more likely to tunnel first. Therefore, in the arrangement of FIGS. 5a and 5b, a higher band gap material 41 is provided on the n-type side of the quantum dot in order to inhibit tunneling of the electron and to retain the electron and hole into the quantum dot long enough for emission to occur.

In an example of a layer structure for the device of FIG. 5a, the upper layer is GaAs, the quantum dots are InAs and the lower layer 41 is AlGaAs. FIG. 5c shows a modification of the device of FIG. 5a where the quantum dots are formed in an GaAs region (as per FIG. 4a), but the upper layer 45 is AlGaAs, but with a lower Al content than lower layer 41. FIG. 5d shows the corresponding band diagram.

FIGS. 6a and 6b show a second variation where the spacing between the potential barriers is reduced to a minimal value. In this case the high bandgap material still increases the confinement of the carriers.

In FIGS. 6a and 6b show a further design in accordance with an embodiment of the present invention. Here, a plurality of quantum dots are formed at interface 61 between two barrier materials 63 and 65. The lower barrier material 63 is connected to n-type material 67 and the upper barrier layer 65 is connected to a p-type material 69. This design could be realised if there was a InAs quantum dot which is sandwiched between two barrier layers for example AlGaAs. The band gap of AlGaAs is 2.2 eV which is considerably larger than the 1.5 eV band gap seen in GaAs.

By forming quantum dots in AlGaAs, large fields can be applied with carriers trapped in the dot. This can lead to tuning over a wavelength range of more than 20 nm as greater than 400 KV/cm of field may be applied without destroying emission efficiency. However, by forming quantum dots in AlGaAs, the properties of the quantum dots can be changed.

Also, if the dots are grown on one material and then covered with a different material then their properties will change. For instance, it is known that growth of QDs on AlAs increases the shape-asymmetry of the QDs leading to a larger fine structure splitting when there is zero electric field across the dots.

The rate of change of the fine structure splitting with applied electric field is higher for dots grown within AlGaAs, which are known to be have larger space asymmetry as the aluminium composition increases. Therefore, dots with large space asymmetry are believed to be of particular use when zero or low FSS is required due to their enhanced tuning properties as a larger fraction of dots could be tuned to minimise the fine structure splitting.

The inventors observed experimentally that InAs dots encapsulated in 75% AlGaAs have a very large wavelength tuning range, greater than 10 s of nanometers.

Table 1 shows a comparison of the devices described with reference to FIGS. 3 to 6 inclusive.

Figure 3:
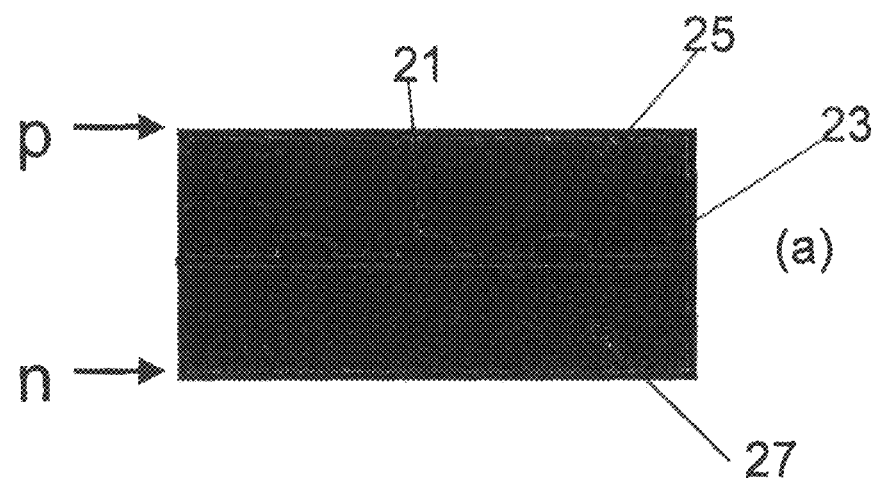
FIG. 3a is a schematic of a basic structure of a photon emitter in accordance with the prior art and FIG. 3b is its corresponding band diagram.
Figure 3:
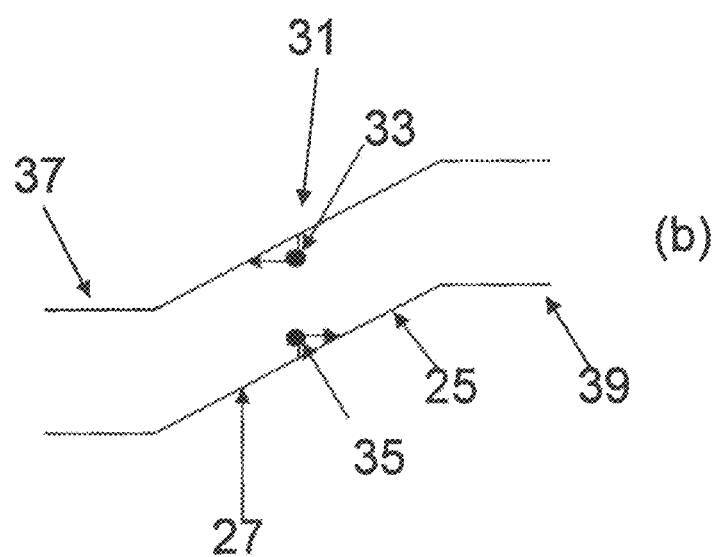
Figure 6:
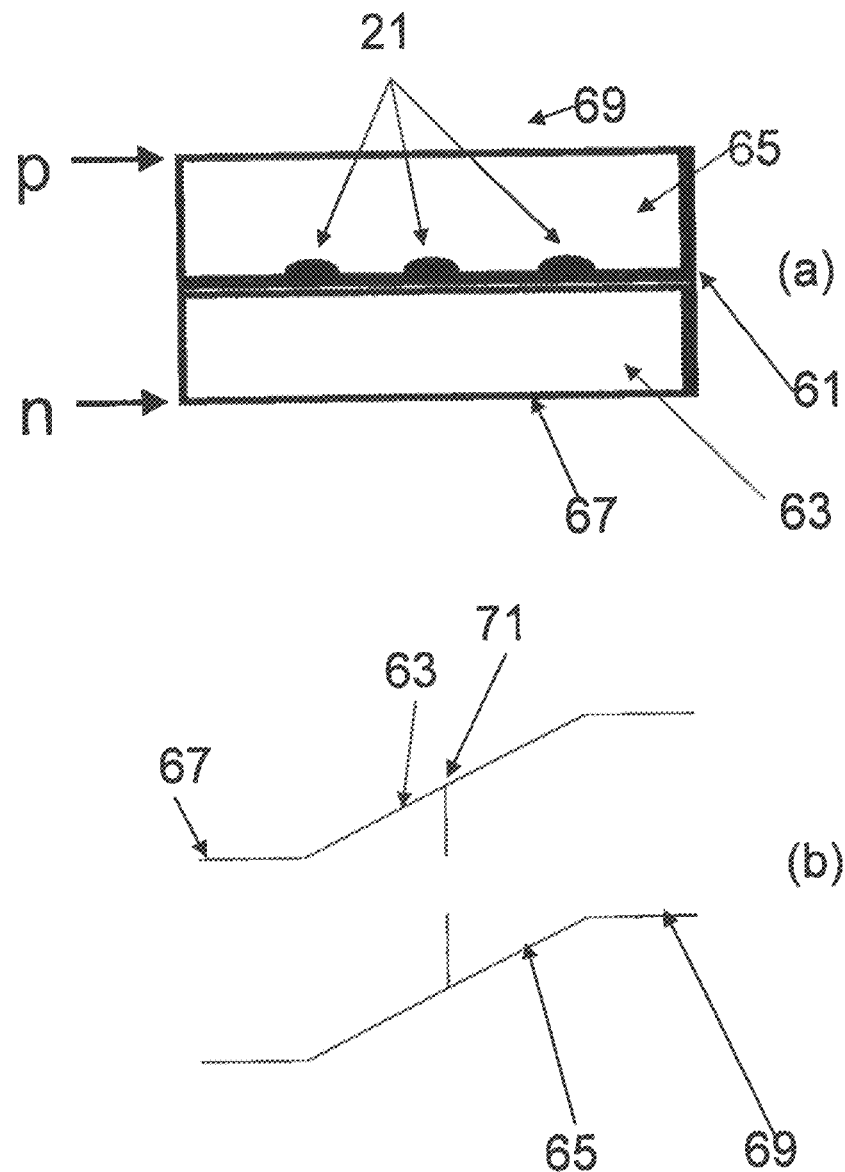
FIG. 6a is a schematic of a photon emitter in accordance with a further embodiment of the present invention and FIG. 6b is its corresponding band diagram.
Figure 7:
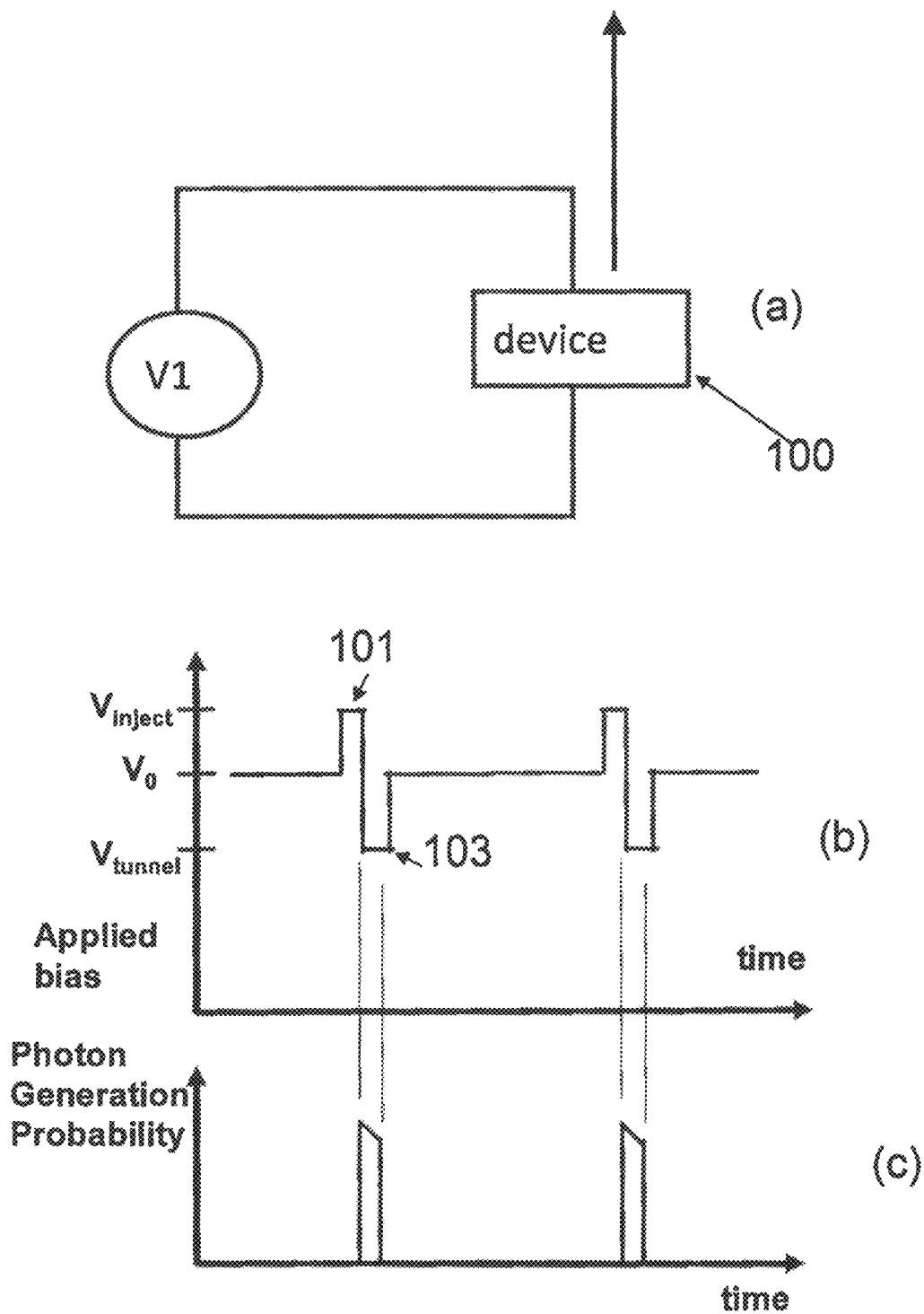
FIG. 7a is a schematic of a photon emitter being operated in accordance with a first configuration.
FIG. 7b is a plot of the bias applied to the device shown in FIG. 7a and FIG. 7c is a plot of the photon generation probability.

|  | Device of FIG. 3 | Device of FIG. 4 | Device of FIG. 5 | Device of FIG. 6 |
|---|---|---|---|---|
| Built in dipole moment | <0.05 nm.e | ~−0.05 nm.e | <0.5 nm.e | not determined |
| Current flow though device | 1.45 V | >2.1 V | >2.1 V | >2.1 V |
| Max. E field we can apply and see PL emission | 90 KV/cm | 460 KV/cm | 160 KV/cm | 460 KV/cm |
| wavelength tuning range observed | Up to 0.3 nm | ~20 nm | ~4 nm | ~20 nm |

The energy, E, of a quantum-confined state in an electric field is shifted by the Stark effect according to the formula $$E=E_0-pF+\beta F^2$$

Where $E_0$ is the energy at zero field, p the "permanent dipole" moment and $\beta$ the "polarizability" (which is negative). p gives a measure of the vertical separation between electron and hole, p=eD, where D points from negative to positive charge. F is the electric field, defined as the net force on a positive test charge.

Further, the maximum electric field which can be vertically applied across the quantum dots which allow photoluminescence (PL) emission to be observed is considerably larger in the devices of FIGS. 4 to 6 when compared with that of FIG. 3. However, particularly large fields are seen for devices of FIGS. 4 and 6. This also translates into a larger wavelength tuning range. For the conventional device design shown with reference to FIG. 3, a tuning range of less than 0.3 nm is observed. However, this increases to over 20 nm for the devices of FIGS. 4 and 6.

Possible modes of operation of the device will now be described with reference to FIGS. 7 to 10. The device will be described in its most simple form containing a single quantum dot where a bias can be applied across the quantum dot.

In the device configuration of FIG. 7a, the electrical field is applied perpendicular to the plane of the layers. The layers have p-i-n-type structure. First, with reference to FIG. 7b a bias at a first level 101 is applied which is greater than the threshold voltage of the diode so that electrons and holes can populate the quantum dot. Next, a bias is applied at a second level 103 which is less than the threshold voltage. This bias stops current injection and shifts the emission of the quantum dot via the Stark effect to an energy equal to the desired output energy of the device. The applied voltage is shown in FIG. 7b. When the voltage is at the second voltage level 103, there is higher probability of a photon being generated as indicated in FIG. 7c.

By using the devices in accordance with the embodiments of the present invention, a larger range of second voltage levels are possible and hence, the device may be configured to output over a larger range of emission wavelengths.

The principle of the mode of operation is described in more detail with reference to Applied Physics Letters 92, 193503 2008.

Figure 8:
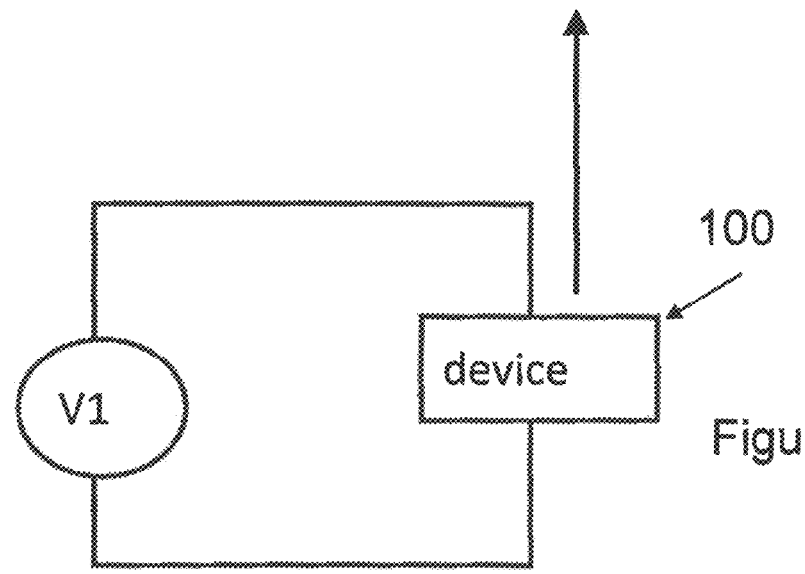
FIG. 8 is a schematic of a device in accordance with the present invention operated in accordance with a second mode of operation.

FIG. 8 shows a second mode of operation. Here, the device 100 is again subjected to an electric field which is applied perpendicular to the plane of the layers of the device. The device operates using a sequential injection mechanism. Here, first, a bias is applied which allows electrons (holes) to resonantly tunnel into the quantum dot. Once this has been achieved, the bias is rapidly switched to a region where holes (electrons) can resonantly tunnel into the optically active region. For this arrangement to work, it is important that the device can switch and tunnel in a hole (electron) faster than the electron (hole) tunnels out. The principle of this type of arrangement is described with reference to Kim et al, Nature 397, 500-503 (1999).

This mode of operation which is known as "resonant, sequential" operation achieves high photon purity which is evident in narrower emission lines. Once the electron (hole) and the hole (electron) have tunneled into the quantum dot, the device is returned to a third voltage level which defines the emission wavelength of the quantum dot described with reference to FIG. 7.

Figure 9:
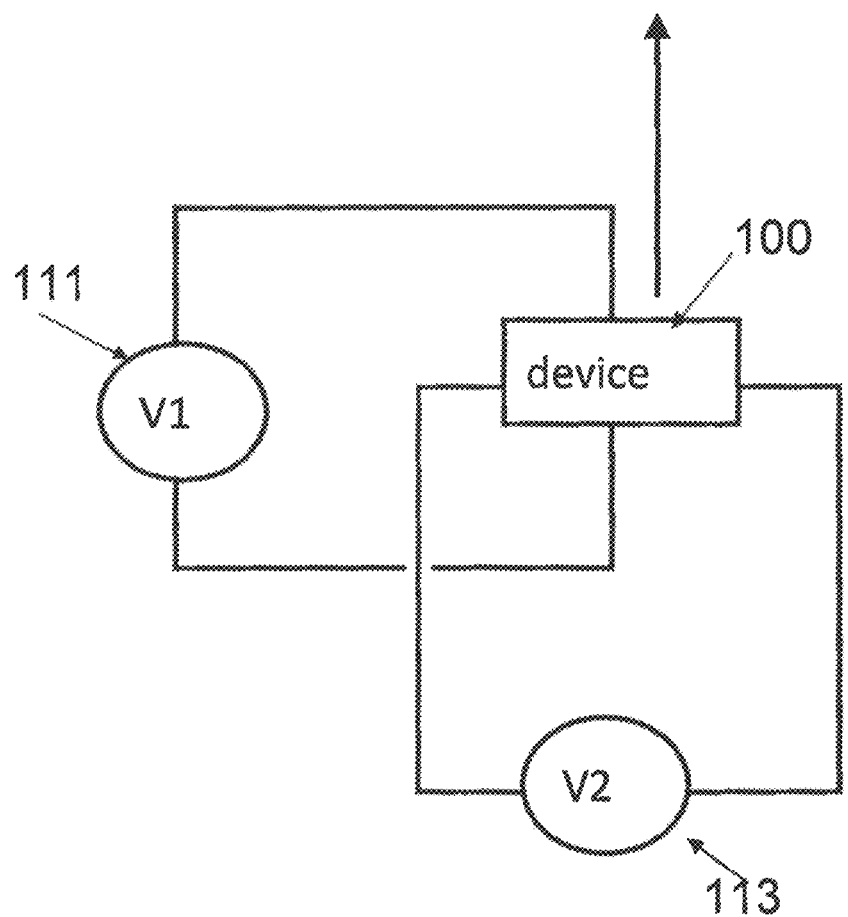
FIG. 9 is a schematic of a configuration of the device of the present invention operated in accordance with a third mode of operation.

In the mode described with reference to FIG. 9, the device 100 is subjected to a field applied vertically to the layers by source 111 and a further voltage source 113 is provided in the plane of the layers. The voltage source 113 is provided in the plane of the layers and is used to inject carriers into the quantum dot within device 100. The first voltage source 111 is provided to control the emission wavelength or fine structure splitting of the quantum dot.

Figure 10:
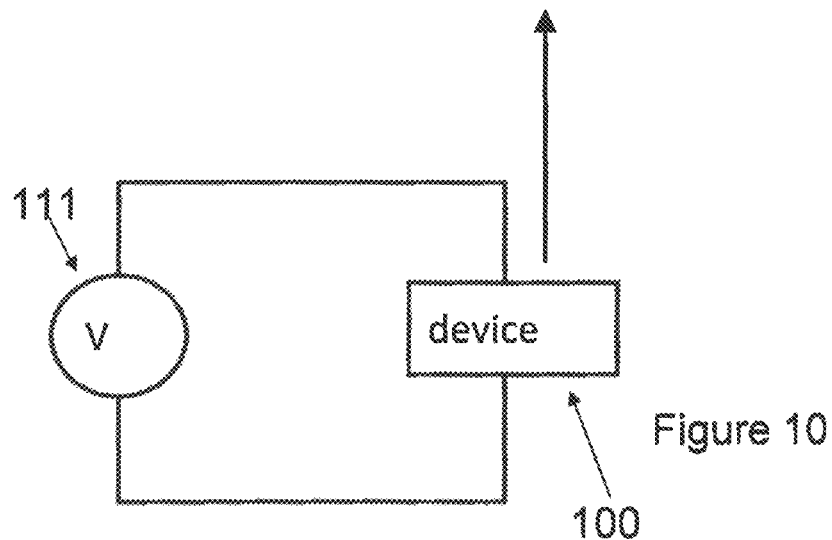
FIG. 10 is a schematic of a device in accordance with the present invention operated in accordance with a fourth mode of operation.

FIG. 10 shows a yet further variation on the mode of operation. In the device of FIG. 10, the device 100 is again subjected to a vertical electric field applied orthogonal to the plane of the layers from source 111. Carriers are injected into the quantum dot by optical excitation. By setting the voltage applied by source 111, it is possible to control the emission wavelength or fine structure splitting of the quantum dot.

Figure 11:
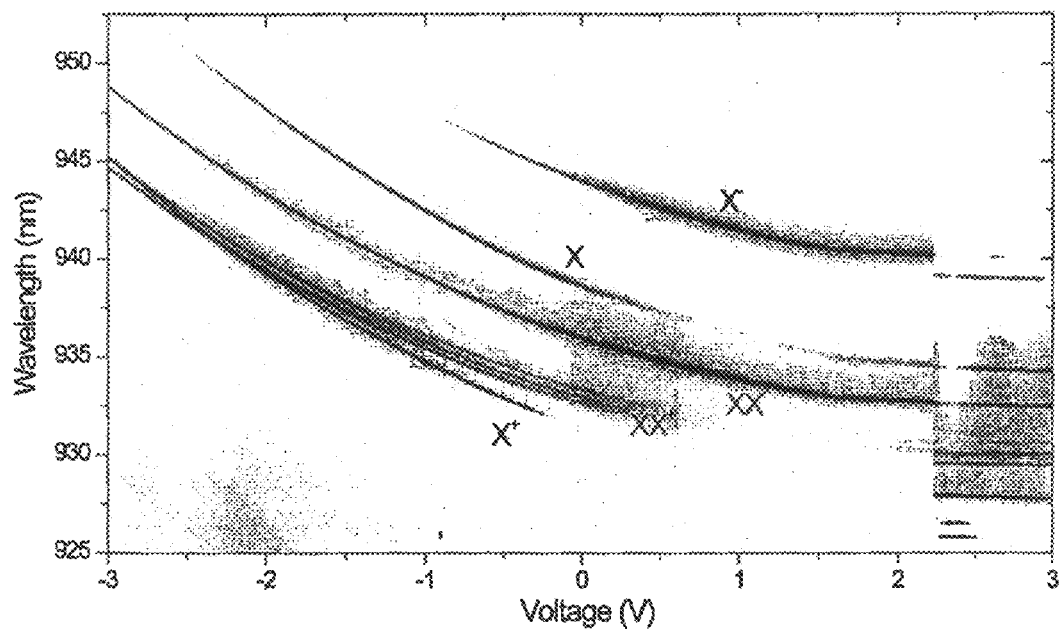
FIG. 11 is a plot showing photoluminescence emission of a photon emitter described with reference to FIG. 6 against bias voltage.

FIG. 11 shows the output of a quantum dot in accordance with an embodiment of the present invention tuned over a reasonably large range. The design of device used to produce the results of FIG. 11 is that shown with reference to FIGS. 4a and 4b. By performing power dependence and polarisation measurements, it is possible to identify particular transitions in the quantum dot.

The line marked X is due to single neutral exciton where a single electron in the conduction band and a single hole in the valence band combine to leave the dot completely unoccupied and emit a photon. The line marked XX is due to the neutral bi-exciton decay. This is when there are two electrons in the conduction band and two holes in the valence band, one electron on the conduction band combines with a single electron in the valence band emitting a photon leaving behind a single electron in the conduction band and a single hole in the valence band.

The line marked X− is due to decay from a quantum dot which is populated with two electrons in the conduction band and a single hole in the valence band. One electron in the conduction band combines with the single hole in the valence band leaving behind a single electron in the conduction band. This decay is known as the negative exciton decay. Similarly positive exciton decay X+ is when the starting state is a single electron in the conduction band and two holes in the valence band. It is also possible to have charged decay of higher order excitons, the exciton XX+ comprises three electrons in the conduction band and two holes in the valence band.

It can be seen from FIG. 11 that the different exciton emission lines dominate at different tuning voltages. Therefore, it is possible to control or favour a particular type of emission. For example, for entangled photon generation, X2/X decay is preferred so a bias device near 0 volts for this particular sample is desirable.

The X− exciton often has a narrow linewidth which is useful for generating high purity photon states. Therefore, it may be desirable to bias the device between 1 and 2.2 volts where this line dominates.

The ability to tune over a large wavelength makes it possible to tune the output characteristics of two independent sources to be similar enough to allow entanglement. This allows entanglement of photons emitted from different sources which has applications for quantum repeaters and quantum computing. In quantum computing the ability to entangle photons from different sources allows the entanglement of solid state qubits.

The above photon source also provides a photon source which can be more easily configured as a source of entangled photons. To produce an entangled photon source it is desirable to have a quantum dot where there is no fine structure splitting in the photoluminescence from the quantum dot. Using embodiments which allow tuning over a wide range of electric fields, it is possible to operate the source at fields where fine structure splitting is minimised. Fine structure splitting occurs during the biexciton-to-exciton to-empty cascade decay.

Finally, the type of excitonic decay which dominates the output of a quantum dot is dependent on the electric field applied. Therefore, the ability to tune the output over a wide wavelength range allows the dot to be configured such that specific excitonic decay dominates the output.

The enhanced confinement will also allow the devices to be operated at higher temperatures.

With devices in accordance with embodiments of the present invention it is possible to apply very large vertical electric fields to QDs whilst retaining a high luminescence efficiency. In all prior art, fields of less than a few tens of KV cm$^{-1}$ could be applied before carriers would tunnel out of the dot. In devices according to embodiments of the present invention it is possible to apply fields of up to 500 KV cm$^{-1}$ and still observe high internal quantum efficiency.

Figure 12:
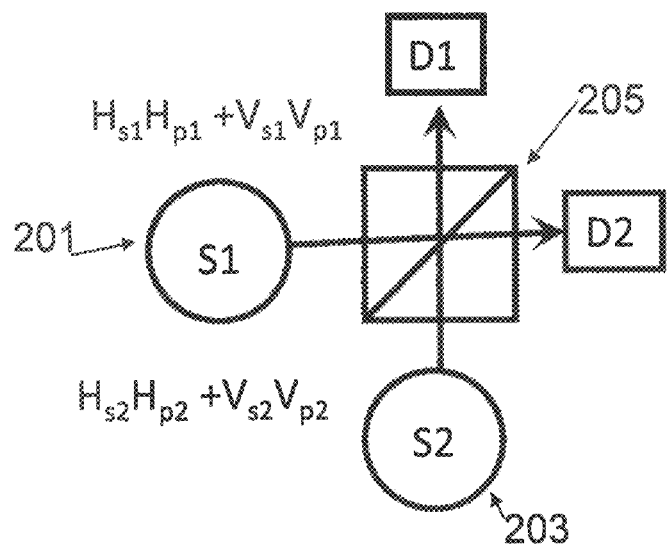
FIG. 12 is a schematic of an apparatus for creating qubit entanglement using two photon emitters in accordance with an embodiment of the present invention.

FIG. 12 shows a first possible use for a light-source in accordance with an embodiment of the present invention.

FIG. 12 shows such an arrangement where a first source 201 and a second source 203 are configured to have identical emission energies. The sources are also configured such that they emit photons due to bi-exciton or charged-exciton decay. The first source and the second source 201, 203 emit a single photon each leaving either an electron-hole pair or a single charge within the dot.

Each photon produced due to this decay is entangled with the solid state qubit formed by the spin of the carriers or carrier remaining in the quantum dot. If identical photons due to decay are incident on beam splitter 205 from two different photon sources at the same time and an appropriate measurement is performed of each by detectors D1 and D2, the photons will become entangled. This serves to entangle the solid state qubits in sources 201 and 203 with each other. This ability to entangle two solid state qubits has applications in distributed quantum computing.

Figure 13:
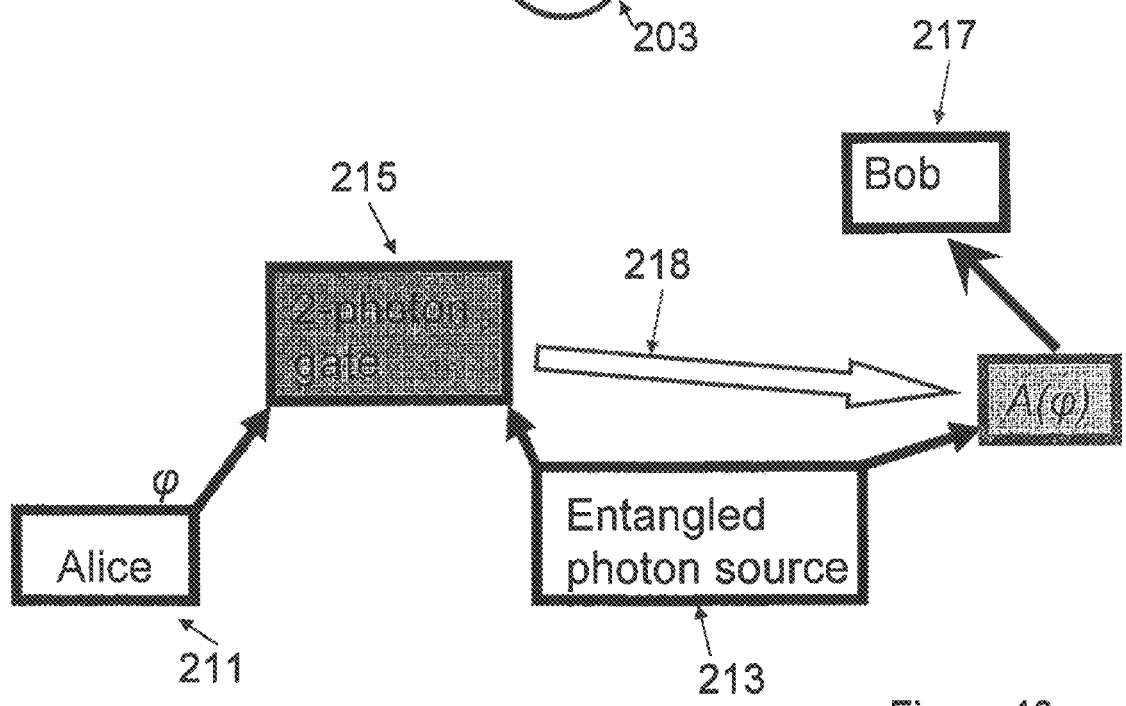
FIG. 13 is a schematic of a quantum repeater using a photon source in accordance with an embodiment of the present invention.

FIG. 13 shows a further use for the sources in accordance with embodiments of the present invention to implement quantum repeater operation. To send information encoded on single photons over long distances, it is desirable to have a quantum repeater, enabling an increase in the distance over which quantum information can be sent from Alice 211 to Bob 217. In our simple example the quantum repeater operation requires a 2 photon gate 215, and entangled photon source 213 and a classical channel 218.

In the arrangement of FIG. 13, the sender Alice 211 has a single photon source. A second photon source which is an entangled photon source 213 produces an entangled pair of photons. It is necessary that one of the photons from the entangled photon source 213 sent to the 2-photon gate 215 is identical to the photon emitted by Alice 211. The other photon of the entangled pair generated by 213 is sent to bob 217. The identical photons are then passed to two-photon gate 215 which performs a measurement which compares them. Based on the result of this measurement classical information can be transmitted to Bob via a channel 218. Bob uses this information to perform a transformation (A(φ)) on the photon the entangled photon source sent to him, thus converting its quantum state to be the same as the initial photon generated by Alice. In this manner, the photon which reached Bob 217 contains the quantum information sent by Alice, and this information has been transmitted over a larger distance than would have been possible had Alice sent her photon directly.

Figure 14:
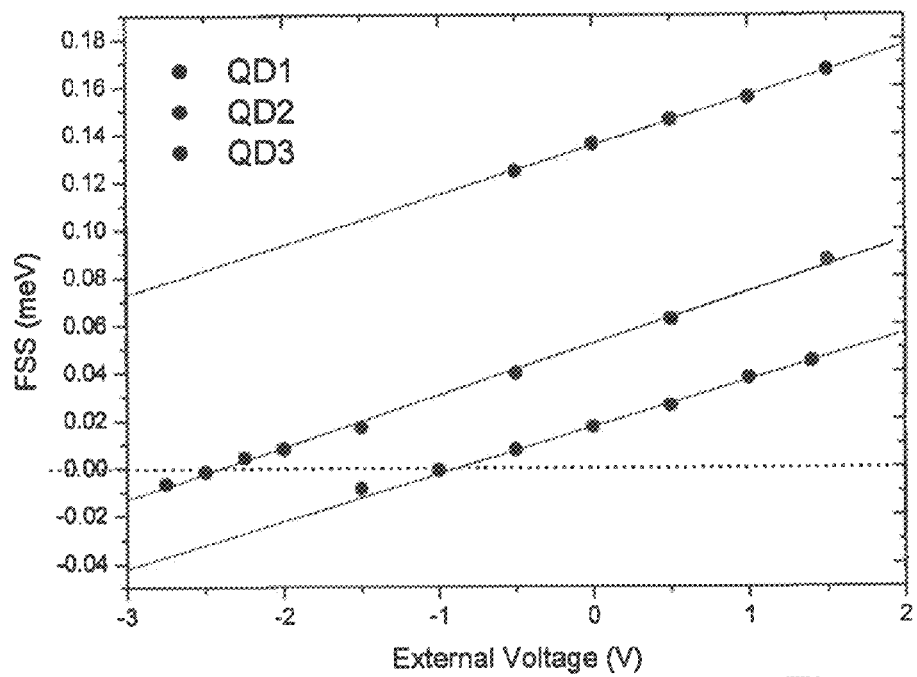
FIG. 14 is a plot showing the fine structure splitting (FSS) against external bias voltage for three photon emitters in accordance with an embodiment of the present invention.

FIG. 14 shows the effects of applying a tuning voltage across the device described with reference to FIG. 4. The fine structure splitting (FSS) is the energy difference between the orthogonally polarised components (H and V) of the exciton state. Reducing the FSS to zero is desirable when obtaining entangled photon generation from quantum dots. Previous demonstrations of entangled photon generation have used: (i) in-plane magnetic field; (ii) annealing of the samples; or (iii) extensive searching for a dot which has zero FSS naturally. In all entanglement demonstrations with a quantum dot source thus far, zero FSS splitting can only be obtained at 885 nanometers where emission from the background of the "wetting layer" can be detrimental to performance.

These solutions are complex, time consuming, and require us to find suitable quantum dots in an ensemble. The solution of the present invention using the application of a vertical electric field is relatively easy. In addition, this technique allows us to vary the FSS on time scales comparable to or faster than the radiative lifetimes of the quantum states, which may be advantageous, but is not possible with the previously used techniques.

Thus, a large vertical field can be used to tune the fine structure splitting in a similar manner for quantum dots in a device described with reference to FIG. 4, where emission occurs between 930 and 950 nm In all quantum dots studied, the FSS varies linearly with the applied bias in a similar manner.

Through growth of quantum dots with different properties, it may be possible to extend the emission to other wavelengths (i.e. the Telecoms wavelengths of 1300 and 1550 nanometers) and/or quantum dot types such as InAs/InP.

In QDs in InP/InAs/InP system is expected to have FSS's randomly distributed around FSS=zero with a scatter of a about 10 μeV, when emitting in the range 0.75-0.95 eV.

The embodiment of the present invention can be used to reduce the FSS to zero for every individual QD of this system.

In GaAs/InAs/GaAs QDs the FSS at zero field varies randomly, with a Gaussian distribution from dot to dot over a wider range. At 1.4 eV emission energy the mean FSS is zero, with "scatter" closer to 50 μeV. As the FSS changes at a "rate"=0.28 μeV per KVcm$^{-1}$ for these dots, a device that can apply a fields over that range of "scatter"/"rate"=180 KVcm$^{-1}$ can tune every dot to zero. For a smaller tuning range only a subset of dots can be tuned to zero FSS.

For QDs at emitting at 1.32 eV the mean FSS is ~100 ueV with a scatter of 100 μeV so a tuning range of 150 μeV will mean all QD can be tuned to zero, which corresponds to a field range of 530 KVcm$^{-1}$.

Figure 15:
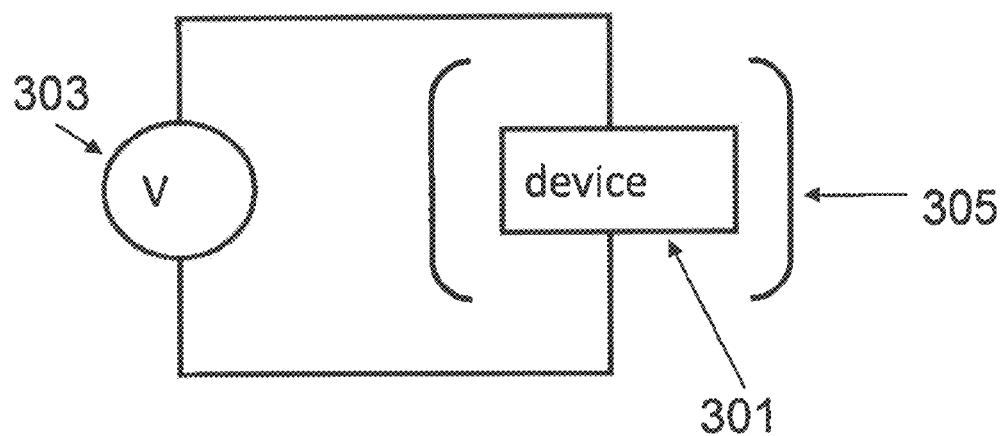
FIG. 15 is a photon emitter in accordance with the present invention provided with cavity.

FIG. 15 shows a schematic of a device configuration in accordance with an embodiment of the present invention where the device 301 is subjected to a vertical electric field from source 303. Further, the device comprises a cavity 305. The cavity is provided around the quantum dots and is either used to enhance emission in one direction hence increasing efficiency and/or to alter the emission properties of the quantum dot.

The cavities could include those based on Bragg mirrors of quarter wavelength layers of alternating refractive index, photonic crystals which are well-known in the art or more unusual arrangements.

Figure 16:
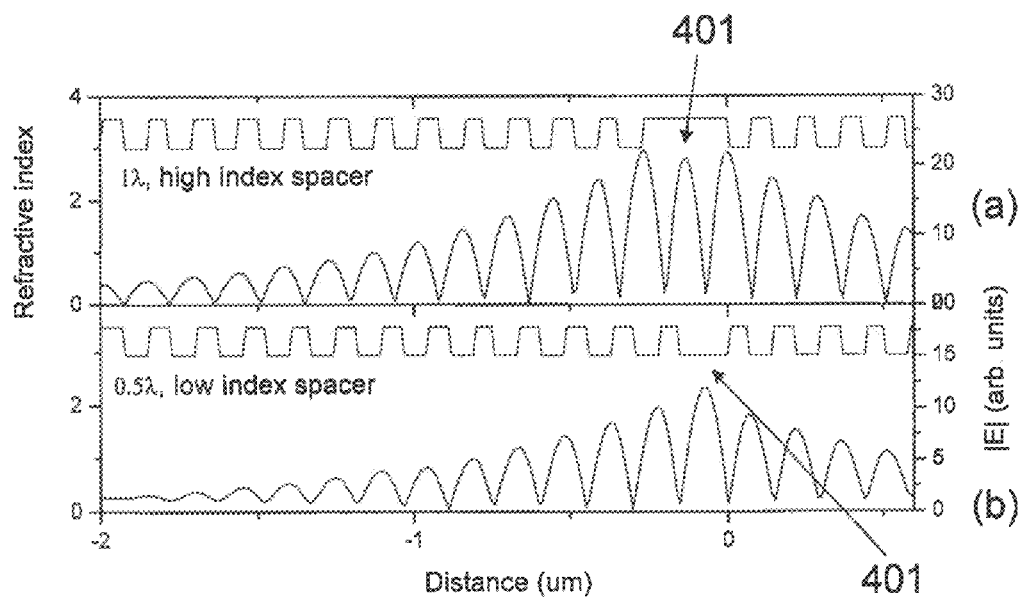
FIGS. 16a and 16b are plots showing the refractive index and optical electric field in a cavity against distance from the edge of the spacer layer at the center of the cavity, the refractive index of the cavity spacer differs between FIGS. 16a and 16b.

In the design shown in FIGS. 4-6, the quantum dots may be placed within a cavity which may be of a high refractive index material or a low refractive index material. FIG. 16 shows the refractive index of the layers and the electric field along the y-axis along a distance on the x-axis. A cavity 401 exists in the form of a spacer.

Figure 17:
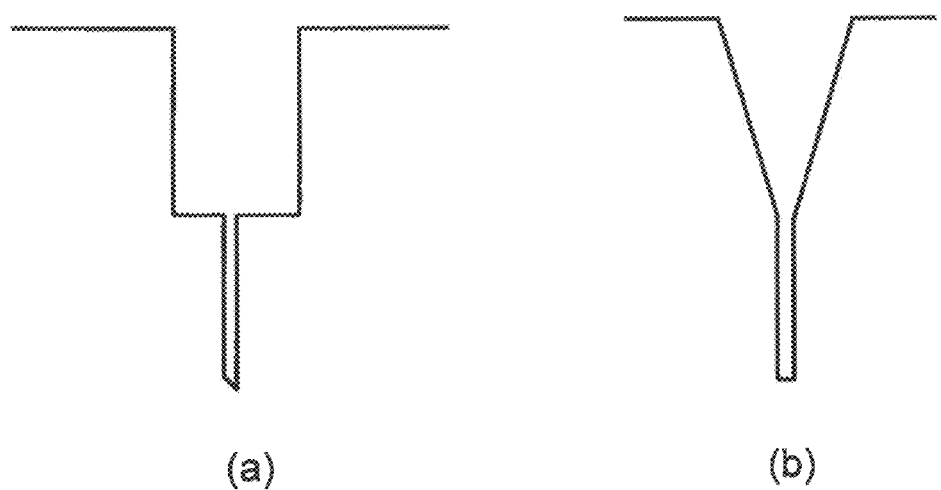
FIGS. 17a and 17b show different quantum well profiles.

If the cavity is predominately of the higher refractive index (i.e. GaAs) it is desirable to use the criteria shown in FIG. 17a where the spacer has a thickness of ½(N+1)λ with QDs at (2M)λ/4 from edge of the spacer, where, N, M=non-zero integer.

If however, the spacer and cavity is dominantly of the low refractive index (i.e. AlGaAs), then the criteria shown in FIG. 17b must be used where the spacer has a thickness of ½(N)λ with QDs at (2M−1)λ/4 from edge.

The above designs ensure that the light is confined as closely as possible to the centre of the cavity and position the dot layer at a maximum in the optical electric field.

In addition to considerations to the cavity, different types of quantum well arrangement may be used to confine the states in the quantum dot. FIGS. 18a and 18b show possible quantum wells. FIG. 18a shows the square type quantum well which is also described with reference to FIG. 4. FIG. 18b shows a variable composition quantum well where carriers will tend to accumulate at the lowest potential which is near the quantum dot. It is also possible to vary the composition such that the energy profile is parabolic, linear or some other varying profile. The confined states of the quantum well may be engineered to have a certain relation to the confined states of the quantum dot. For example, if the confined states of the quantum well are separated by one phonon energy, capture into the quantum dot may be enhanced.

Figure 18:
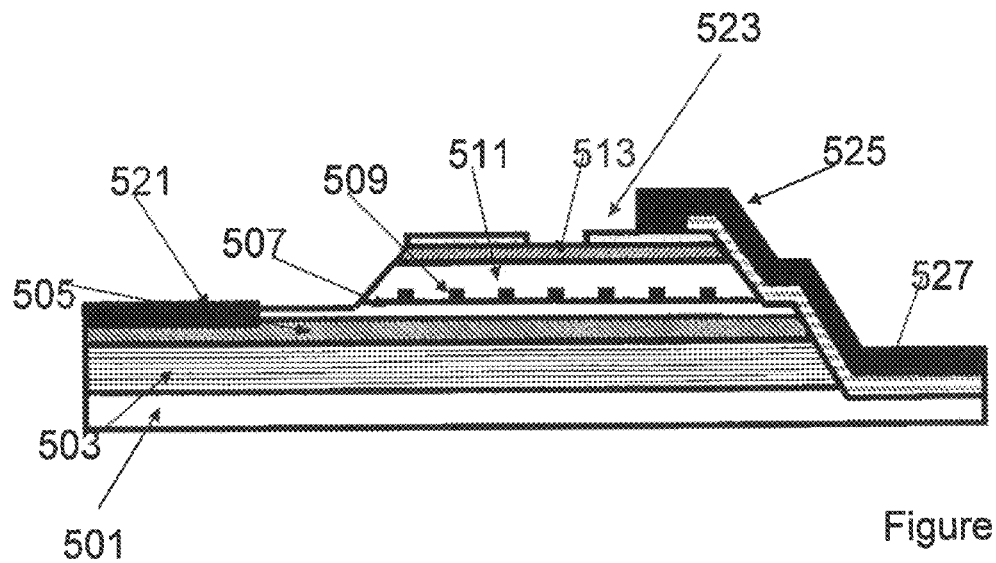
FIG. 18 is a detailed device schematic of a photon emitter in accordance with an embodiment of the present invention.

FIG. 18 shows a device in accordance with an embodiment of the present invention with details of the layer structure. For this device it is assumed that the emission wavelength of the device is 955 nm and n(GaAs)=3.472 and n(95% AlGaAs) =2.947, n75%=3.088 that the Quarter Wavelength thickness of GaAs is 955/(4*3.472)=68.764 nm and that the Quarter Wavelength thickness of 95% AlGaAs is 81.015 nm.

The device is formed on a substrate 501 with an undoped buffer layer. Typically, the substrate will be GaAs. Next, lower Bragg mirror layer 503 is formed comprising a number of alternating layers of high/low index material each a quarter of an optical wavelength in thickness. The last few repeats may be N-doped.

Overlying and in contact with n-type lower Bragg region 505 is lower cavity spacer layer. Lower cavity spacer layer comprises 75% AlGaAs (which may be deposited in a short period superlattice, or with all three elements impinging on the substrate at the same time). Overlying and in contact with the lower cavity spacer layer is deposited half the quantum well.

Quantum dot layer 509 is then formed overlying. For example, in this particular embodiment, more than 1.7 monolayers of InAs sources was deposited and this "self assembled" into quantum dots in a manner well known in the art.

Next, the second half of the quantum well is deposited and then the upper spacer layer 511 is formed overlying.

Overlying and in contact with upper spacer layer 511 is upper Bragg mirror 513. The final few layers of this mirror were doped P in our example to allow formation of an ohmic contact.

Once the layer growth has finished, the device is etched down to n-doped mirror layer 505 to form n-type contact 521 and p-type contacts are provided overlying and in contact with upper mirror layer 513. The contact metal 525 overlies an insulating layer 527 which is provided to prevent shorting of the contact metal to the underlying layers.

In the above, the Bragg mirror is formed using alternating higher and lower refractive index layers each of a quarter of the wavelength thick. The larger the number of layers, the higher reflectivity is achieved. The greater the contrast in refractive index, also, the higher reflectivity is achieved. In the above, GaAs/AlGaAs layers are used which can be grown monolithically and formed easily. However, these have an index difference of 0.5 at approximately 900 nm. Therefore, it may be preferable to use dielectrics such as $SiO_2/TiO_2$ or $SiO_2/Si_3N_4$ which are deposited at a later date and can achieve higher index contrasts.

Figure 19:
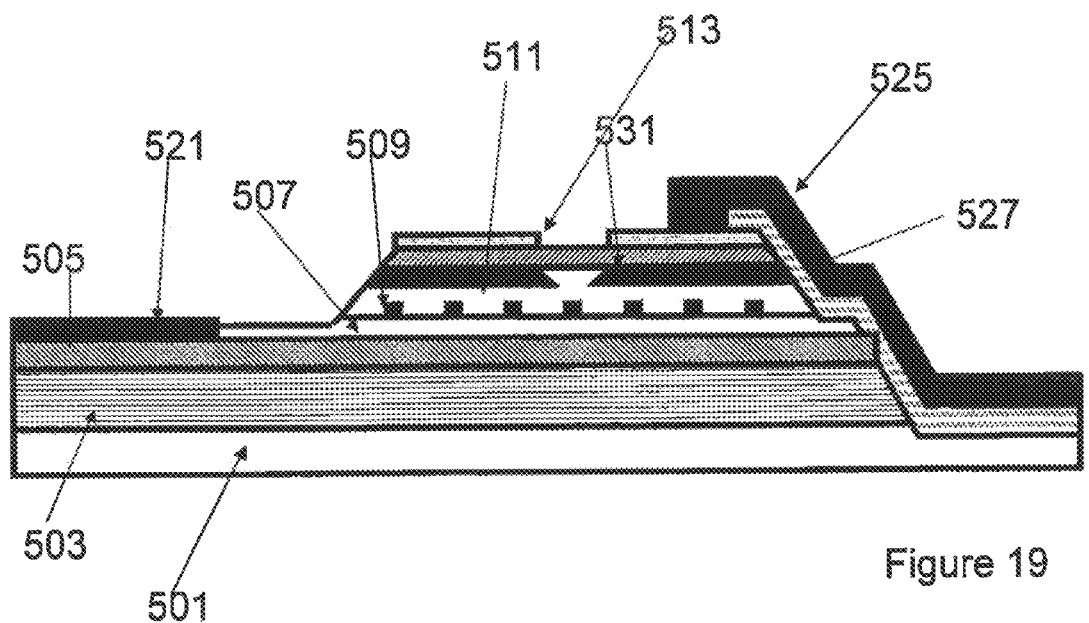
FIG. 19 is a detailed device schematic of a photon emitter in accordance with a further embodiment of the present invention where emission from a single quantum dot is isolated.

FIG. 19 shows variation on the device of FIG. 18. To avoid any unnecessary repetition, like reference numerals will be used to denote like features. The main difference of the device of FIG. 20 compared to that of FIG. 19 is the formation of the insulating layer 531 which is provided within the spacer layer which limits the current flow small area. This means that it is possible to inject into a single quantum dot. Such a layer can be formed by the oxidation of a high Al content AlGaAs layer in a humid atmosphere. The combination of a high reflectivity Bragg mirror and lateral change in refractive index from the oxidized layer can lead to 3-D optical confinement and alters the emission properties of the quantum dot. This principle is described in more detail with reference to APPLIED PHYSICS LETTERS 90, 233514 2007 and *New Journal of Physics* 10 (2008) 043035.

While certain embodiments have been described, these embodiments have been presented by way of example only, and are not intended to limit the scope of the inventions. Indeed, the novel sources, systems, repeaters and methods described herein may be embodied in a variety of other forms; furthermore, various omissions, substitutions and changes in the form of the sources, systems, repeaters and methods described herein may be made without departing from the spirit of the inventions. The accompanying claims and their equivalents are intended to cover such forms or modifications as would fall within the scope and spirit of the inventions.

The invention claimed is:

1. A photon source adapted to output entangled photons comprising
   a semiconductor heterostructure, said semiconductor heterostructure comprising a quantum well, a barrier region adjacent said quantum well, and
   a quantum dot provided in said quantum well,
   the photon source further comprising
   electrical contacts and a voltage source coupled to first and second electrical contacts configured to apply a tuneable electric field across said quantum dot to control the emission energy of said quantum dot, said electric field being tuneable across an operating range having an upper limit of 100 $KVcm^{-1}$ or greater, and wherein the barrier region is configured such that at an electric field of at least 100 $KVcm^{-1}$ the tunneling time of carriers from said quantum dot is greater than the radiative decay time of an exciton in said quantum dot, said photon source being configured such that emission from a single quantum dot exits said photon source, the photon source further comprising a light source configured to provide carriers to said quantum dot to excite a bi-exciton or higher order exciton in said quantum dot, wherein the field applied across the quantum dot is configured to minimise fine structure splitting.

2. A photon source according to claim 1, said quantum well comprising a material having a lower band gap than said barrier region, and wherein said lower band gap material is provided between two barrier regions, said barrier regions being formed on opposing sides of said quantum dot.

3. A photon source according to claim 1, wherein said quantum dot comprises InAs, said quantum well comprises GaAs and said at least one barrier region comprises AlGaAs or AlAs.

4. A photon source according to claim 1, wherein said quantum well has a square profile.

5. A photon source according to claim 1, further comprising an optical cavity.

6. A photon source according to claim 1, comprising a plurality of quantum dots, said photon source further comprising a layer provided with an aperture configured to allow carrier injection into a single quantum dot.

7. A photon source according to claim 1, comprising a plurality of quantum dots, said photon source further comprising an opaque layer configured to isolate the emission from one quantum dot.

8. A system for producing entanglement, said system comprising a first photon source in accordance with claim 1 and
a second photon source in accordance with claim 1, said first and second photon sources being tuned to emit identical photons,
said system further comprising
an interferometer configured to provide entanglement between identical photons output from the two sources.

9. A quantum repeater comprising
a first photon source in accordance with claim 1,
a second photon source and
an interferometer configured to interfere a first photon from a pair of photons output by said first source and a photon from the second source, wherein the first photon source is configured to output an entangled pair of photons wherein one of the photons is identical to a photon outputted by the second photon source, such that during interference by said interferometer, the state of a photon emitted by the second photon source is mapped to the second photon from said photon pair.

* * * * *